United States Patent [19]

Ohtsubo et al.

[11] Patent Number: 5,491,452
[45] Date of Patent: Feb. 13, 1996

[54] PELTIER ELEMENT AS SERIES NOISE CLAMP

[75] Inventors: Kazuo Ohtsubo, Tokyo; Kinichi Uemura, Yokohama, both of Japan

[73] Assignees: Melcor Japan Co., Ltd., Tokyo; Kinichi Uemura, Kanagawa, both of Japan

[21] Appl. No.: 329,688

[22] Filed: Oct. 26, 1994

Related U.S. Application Data

[63] Continuation of Ser. No. 753,707, Sep. 3, 1991, abandoned.

[30] Foreign Application Priority Data

Sep. 18, 1990 [JP] Japan .................................. 2-249662
Dec. 17, 1990 [JP] Japan .................................. 2-417874
Mar. 4, 1991 [JP] Japan .................................. 3-123202
Jul. 19, 1991 [JP] Japan .................................. 3-203577

[51] Int. Cl.$^6$ ............................................. H01L 35/00
[52] U.S. Cl. ........................... 327/552; 327/314; 136/203
[58] Field of Search ............................. 327/551, 552, 327/311, 314; 136/203

[56] References Cited

U.S. PATENT DOCUMENTS 3,673,500  6/1972  Mergerian .............................. 327/552

FOREIGN PATENT DOCUMENTS 2039796  2/1972  Germany .............................. 257/930
1173756  12/1969  United Kingdom .................. 257/930

Primary Examiner—William D. Larkins
Attorney, Agent, or Firm—Frishauf, Holtz, Goodman, Langer & Chick

[57] ABSTRACT

Disclosed are a noise eliminating element having a junction of components of two kinds of electroconductive materials, characterized in that the absolute values of the thermoelectric power of the two kinds of materials is 50 $\mu VK^{-1}$ or higher and there is substantially no rectifying action at the junction. Both the Seebeck effect and the Paltier effect occur simultaneous and create a transient phenomena in one element. Because of the transient phenomena in one element and because of the transient phenomenon based on both effects, noises, particularly the standing wave noises generated at around output current near to zero are eliminated. The noise eliminating elements can be inserted in a magnetic circuit of a speaker circuit for acoustic equipment or in a deflecting coil circuit of an electron image display device.

5 Claims, 7 Drawing Sheets

Diode Type Assembly ①

Ⅱ Type Assembly ②

Module Type Assembly ③

FIG. 4
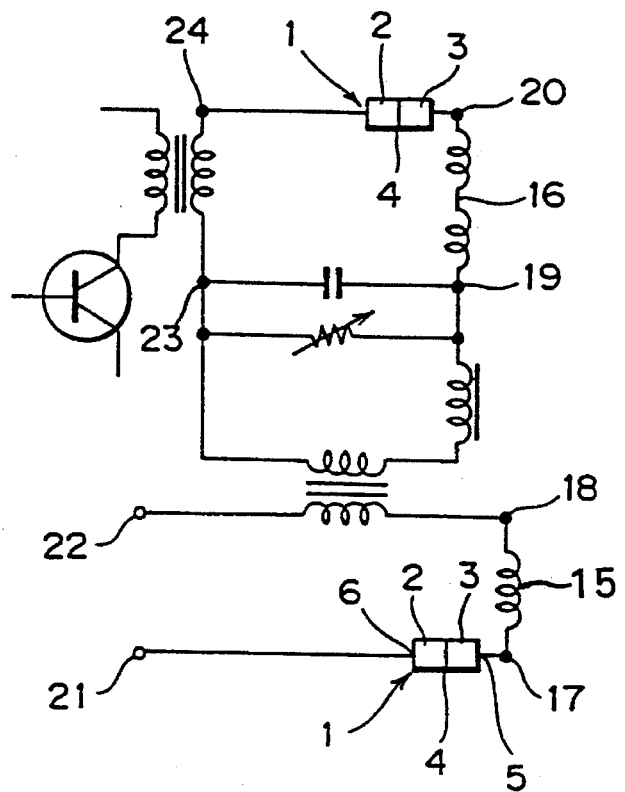
FIG. 5(a)
FIG. 5(b)
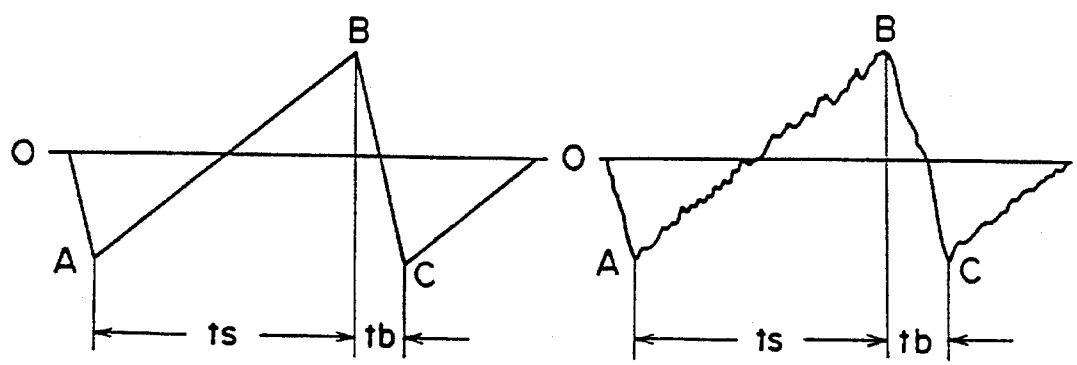

PELTIER ELEMENT AS SERIES NOISE CLAMP

This application is a Continuation of application Ser. No. 07/753,707, filed Sep. 3, 1991 now abandoned.

BACKGROUND OF THE INVENTION

This invention relates to a noise eliminating element which can be used as a sound quality improving element, electronic image quality improving element, etc. and an electrical circuit having the same.

Noises in electrical circuits include electromagnetic noises introduced from alternate current power sources, external noises such as from eletrical discharges, thunder or automobile ignition plugs, and internal noises which take place through complicated behaviors such as thermal motion or scattering of electrons in electronic parts such as resistors or semiconductor elements, etc.

As techniques for eliminating and preventing these noises, there have been known in the state of the art, a noise filter, noise-cut-off transformer, reduction of thermal noises by cooling, electromagnetic shielding, etc. However and these noise eliminating, preventing techniques of the prior art involve such problems as limited effective noise frequency, distortion of original signals, etc.

In the prior art, for the output circuit of an electromagnetic device, a coil has been generally employed. By sending an output signal current through the coil, the magnetic field generated in the coil changes the output signal. The modified signal is finally converted to a desired form such as an electronic acoustic sound wave, an electronic image display, recording display, etc. In the prior art, in such electromagnetic devices, it has been difficult to obtain a noiseless output faithful to the input signal.

In the output circuit of the electromagnetic device of the prior art, particularly near a null point of the current where the current polarity of the output signal is abruptly reversed, an electromagnetic induction voltage through interference with the coil or the external magnetic field is generated, and consequently a noise current is generated. For this reason, the normal output signal receives disturbance, and by repetition of such disturbance, irregular standing wave noises will be generated and grown in the output signal, particularly at a current value close to zero.

Also, within electromagnetic devices, in addition to coils, there are a large number of electrical, electronic parts connected and built in, such as transformers, resistors, condensers, semiconductor elements. The output current including the above standing wave noise is also affected by electrical characteristics such as inductance, conductance, capacitance, etc. possessed by these parts, and the characteristics in material properties such as thermal noise or scattering of electrons. As a result, the standing wave noise of the current particularly around zero current generates more noise with greater energy through interference with the standing wave noise.

Since these standing wave noises overlap the normal output signal which should be inherently faithful to the input signal, they cannot practically convert the input signal faithfully. Such noises in electromagnetic devices make the conversion of input signals to acoustic, image, data recording, etc. incorrect and indistinct, thereby losing scientific value, artistic nature, and also irritating excessively visual and auditory nerves of man, thus creating harm in social environments, artistic cultures, mental hygienes and scientific techniques.

SUMMARY OF THE INVENTION

An object of the present invention is to provide a noise eliminating element which solves the problem of noise of the electromagnetic device of the prior art as described above extremely effectively and according to an inexpensive method, and an electromagnetic device having an electrical circuit with said element assembled therein which can reproduce faithfully the input signal.

The present invention, in order to solve the above task, provides a noise eliminating element having at least one junction of components of different kinds of electroconductive materials, each of at least two components of said components forming partially an electrode, characterized in that the absolute value of the thermoelectric power values of the respective materials in the element is 50 $\mu VK^{-1}$ or higher at the activation temperature of the element and there is substantially no rectifying action at the junction and an electrical circuit having the above noise eliminating element.

BRIEF DESCRIPTION OF THE DRAWINGS

FIG. 4 shows a horizontal or vertical deflecting coil circuit of an electronic image display device having the noise eliminating element according to the present invention.

FIGS. 5a to 5b are illustrations showing the "saw" wave forms, (a) showing the normal "saw" wave form and (b) an irregular "saw" wave form overlapped with standing wave noise.

DETAILED DESCRIPTION OF THE INVENTION

Figure 1A:
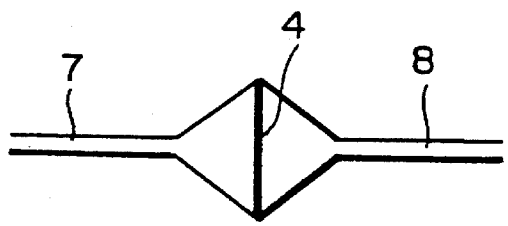
FIGS. 1a to 1f are illustrations showing conceptionally the noise eliminating element according to the present invention.
Figure 1B:
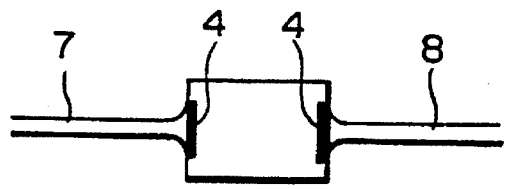
Figure 1C:
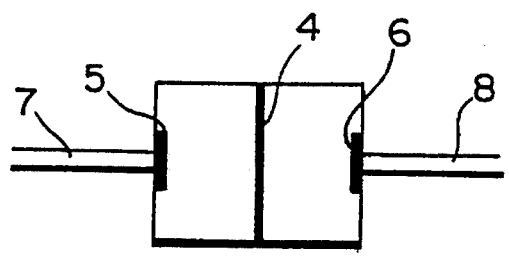
Figure 1D:
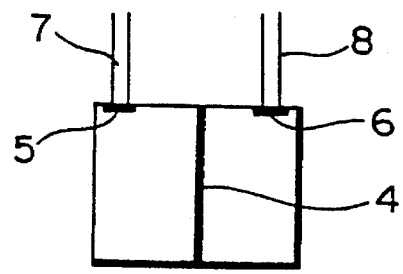
Figure 1E:
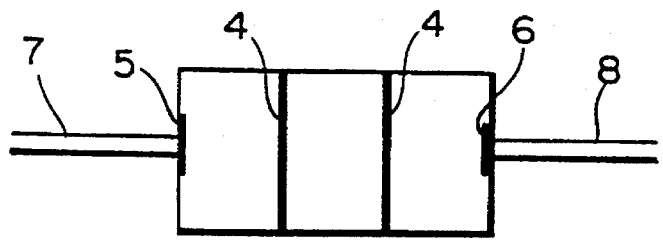
Figure 1F:
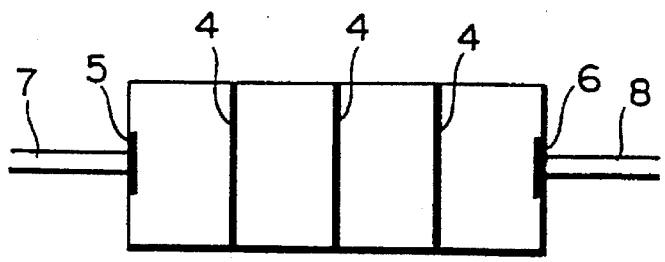
Figure 2A:
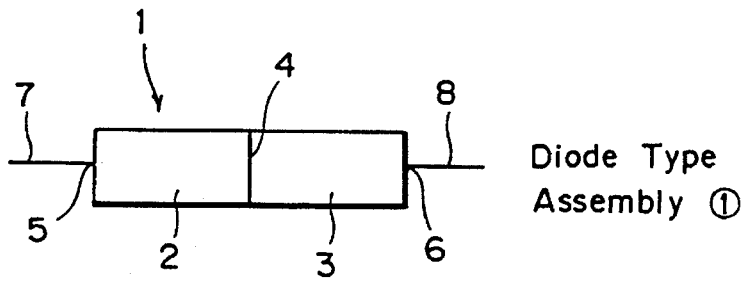
FIGS. 2a to 2d are illustrations showing an embodiment of the noise eliminating element of the present invention, (a) showing the device having bulk materials junctioned, (b) thin film-thick film materials junctioned, (c) the bulk materials junctioned in the Π form with a junctioning metal strip and (d) an element of the module type having a plurality of elements connected in series.
Figure 2B:
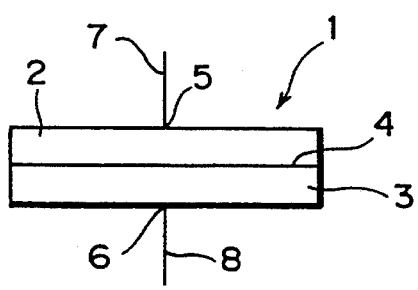
Figure 2C:
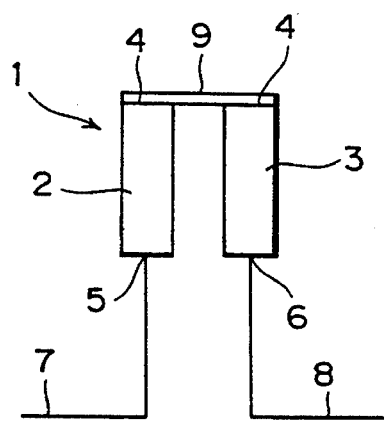
Figure 2D:
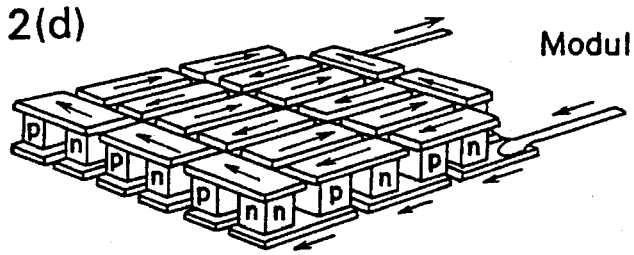

The component of the noise eliminating element of the present invention may be in various forms such as bulk, film and other shapes, and there is no limitation of the method for preparation thereof. Preferable as the material for the element of the present invention are two kinds of thermoelectric semiconductors with different electroconduction types (p-type, n-type). This is because they have high absolute values of thermoelectric power, and therefore give good element characteristics for accomplishing the object of the present invention.

The junction of the components of different kinds of materials also includes, in addition to the junction of the components comprising two kinds of materials junctioned directly to each other, the junction in which a layer comprising another material interposed as a single layer or plural layer is interposed between the both. Also, the portion where an electrode of a different kind of material is junctioned to a bulk or film component forms the junction as mentioned in the present invention. FIG. 1 shows conceptional views of these junctions.

Junction includes not only the state in which both materials are junctioned by diffusion such as welding, brazing, solid phase diffusion bonding, etc., but also the relationship such that electrical conduction is obtained by pressure adhesion or interfacing by mechanical clamping or through the presence of a liquid or a paste. In essence, it refers to the fact that both materials are in contact with each other while maintaining an ohmic electrical conduction state. Preferably, by brazing by use of an adequate brazing material, both materials are joined with sufficient mechanical strength without forming excessive diffusion layer or harmful reaction products.

The thermoelectric powers of various kinds of materials are measured according to the known method. Table 1 and Table 2 show specific examples of the characteristics of various kinds of materials.

The activation temperature of an element is the temperature under the state in which the noise eliminating element is activated. Generally, it is frequently around normal room temperature or slightly higher than that. However, the element may be sometimes used by placing it intentionally in a heated state. This is because the value of the thermoelectric power of the element material may sometimes become advantageous for the performance of the element by heating. For example, for sintered $Bi_2Te_3$, the absolute value of the thermoelectric power is increased with temperature elevation up to about 450 K in p-type and 360 K in n-type.

Unless the value of the relative thermoelectric power exceeds plus or minus 50 $\mu VK^{-1}$ meaning that the absolute value thermoelectric power in $\mu VK^1$ must exceed 50 $\mu VK^{-1}$, the noise eliminating effect of the element has no significant extent. The value should be preferably larger so as to increase performance. Preferably it should exceed plus or minus 100 $\mu VK^{-1}$ more preferably exceed plus or minus 200 $\mu VK^{-1}$, particularly preferably exceed plus or minus 300 $\mu VK^{-1}$.

The electrode of the element is formed by junctioning a wiring material such as copper wire that is used for common electrical circuitry to a thermoelectric material to form the element. Here, "junction" refers to the ohmic electrical contact as described above. When input and output terminals of other electronic components, etc. are directly junctioned to a part of the thermoelectric material, then "a part of the surface of the thermoelectric material" becomes the electrode.

In the element of the present invention, it is demanded that there should be no substantial rectifying action at the junction between different kinds of materials. This is because, the input signal will be distorted if there is rectifying action. By "substantially no rectifying action" is meant that there may be rectifying action of a harmless extent depending on the use of the element. Preferably, the junction has no polarity, and the threshold value of rectifying action is 100 mV or lower. More preferably, the threshold value of rectifying action is 1 mV or lower.

The element of the present invention should have a low electrical resistance. The material should desirably have a low electrical resistivity (e.g. $1 \times 10^4$ $\Omega \cdot m$ or less at normal room temperature). If the electrical resistivity is high, there is the possibility that the output of the electrical equipment may be lowered or the function may be impaired. Preferably, the electrical resistivity is 10 $\Omega \cdot m$ or less, more preferably 0.1 $\Omega \cdot m$ or less.

The material of the element of the present invention may be one having a low thermal conductivity (e.g. $10 Wm^{-1}K^{-1}$ or less at normal temperature). The temperature difference generated at both terminals of the noise eliminating element may result in lowering the temperature difference of the element in a material with a high thermal conductivity, although it is a transient phenomenon within a very short time, whereby there is a fear that the noise eliminating effect of the element may be lowered.

The element of the present invention may be connected anywhere in the electrical circuit for which noise elimination is required. Such an electrical circuit may be in the power circuit, electromagnetic circuit, or electronic circuit.

The element of the present invention may be used particularly preferably in the final output circuit in an electromagnetic circuit having an inductance element (e.g. coil). This is because, at the point immediately before the final output when the current has become large, the noise can be taken off all at once, and therefore the technical, economical and artistic effects of noise removal are conspicuous.

The element of the present invention may be inserted in series into the current circuit to the inductance element (e.g. output coil). Also, the element connected in series into the circuit as mentioned above may be put in parallel with a low resistance between both electrodes. The reason why there is the noise eliminating effect even with this resistance in parallel may be because the resistance of the element is generally extremely low about 1 $\Omega$ or lower, whereby the current also flows similarly through both portions in parallel, and the noise eliminating effect depends on the current which flows through the element.

In the noise eliminating element of the present invention, heat absorption or heat generation takes place according to the Peltier effect in proportion to the three values of the relative thermoelectric power value possessed by said element, the current value flowing through the element and the absolute temperature of the element. Whether it is heat absorption or heat generation depends on the direction in which the current flows through said element.

The cooling power and the heating power according to the Peltier effect are both affected by Joule heating generated by the electrical resistance of said element and the heat conduction passing through said element. However, on the abrupt change of output current in the present invention, the influences of Joule heating and the conduction heat are relatively small. A transient, non-steady state, temperature difference primarily due to the Peltier effect is created between said element junction and both electrodes opposed thereto. The temperature difference will give rise to a non-steady state back electromotive force according to the Seebeck effect in proportion to the relative thermoelectric power possessed by the element. These phenomena will take place by swift behaviors of the electrons at the junction boundary layer of the junction of said element.

The non-steady state back electromotive force as mentioned above acts so as to cancel and inhibit quickly the current by the back electromagnetic induction voltage originated by the inductance of the coil which is the primary cause for the standing wave. As a result, the harmful standing wave is eliminated so as to maintain normal output signals faithful to input signals, whereby an electromagnetic device without noise is obtained.

Referring now to the drawings, the present invention is described in detail. FIG. 2 shows an embodiment of the electroconductive material junction element, FIG. 3 an acoustic equipment circuit with use of said element, and FIG. 4 an electronic image display device, and FIG. 5 the deflected "saw" wave form in the electronic image display circuit.

As shown in FIG. 2, the noise eliminating element (1) of the present embodiment includes the junction (4) of a p-type semiconductor component (2) and an n-type semiconductor component (3) of different electroconduction types. To the electrode junctions (5), (6) at the terminals of each component are connected lead wires (7), (8). The noise eliminating element of this embodiment has three junctions with different kinds of materials, namely the central junction and the electrode junction at the both terminals. FIG. 2(a) shows a noise eliminating element having junctioned bulk components. FIG. 2(b) shows a noise eliminating element having thin film or thick film components junctioned. FIG. 2(c) shows a noise eliminating element having junction in the Π form by use of a junctioning metal strip (9). FIG. 2(d) shows an element of the module type having a plurality of the elements connected electrically in series.

The operating principle of the noise eliminating element of the present embodiment is now explained. For brevity of explanation, the p-type semiconductor (2) and the n-type semiconductor component (3) are made to have the opposite value of the thermoelectric power. The electrical resistance and thermal conductance are similar. The solder at the junction is a metallic material with absolute thermoelectric power of nearly 0, and the electrodes (7), (8) are made of copper wires with thermoelectric power of nearly 0. When a current flows through such a noise eliminating element (1), for example, from the p-type semiconductor component (2) to the n-type semiconductor component (3), at the junction (4) is generated the relative thermoelectric power $\alpha_{R4}$. At the same junction, the current I generates the Peltier heating power $\alpha_{R4}IT_4$ which is proportional to the absolute temperature $T_4$ of the junction (4). On the other hand, at both electrode junctions (5), (6), relative thermoelectric powers $\alpha_{R5}$, $\alpha_{R6}$ are generated. At the same junctions, the current I generates the Peltier cooling power $\alpha_{R5}IT_5$, $\alpha_{R6}IT_6$ which are proportional to the absolute temperatures $T_5$, $T_6$ of the electrode junctions (5), (6). As a result, the temperature of the junction (4) is increased, while the temperatures of both electrode junctions (5), (6) are decreased.

The temperature difference $\Delta T$ (temperature difference between the junction (4) and the electrode junction (5) or between the junction (4) and the electrode junction (6)) is affected by the Joule heating $I^2R$ by the electrical resistance R of the semiconductor component and the heat conduction $K\Delta T$ by the thermal conductance K of the semiconductor component which is the reciprocal number of thermal resistance. The heat conduction and Joule heating transiently change until reaching the steady state. However, on the abrupt change of signal current such as the noise in the case of the present invention, the influences of the Joule heating and heat conduction are relatively small. The temperature difference $\Delta T$ will change very swiftly and transiently primarily by the Peltier heating power and the heating power which is the algebraic sum of the Peltier heating, heat conduction and Joule heating. When the temperature of junction (4) has become $T_h$, and the temperature at the electrode junction (5) or (6) $T_c$, there is created the transient temperature difference $\Delta T_t = T_h - T_c$ between the junction (4) and the electrode junction (5) or (6).

The transient temperature difference $\Delta Tt$ is generated, due to the Seebeck effect. The back electromotive force which is expressed in volts consists of the sum of two terms $\alpha_{R5}\Delta Tt$ and $\alpha_{R6}\Delta Tt$, they are proportional to the relative thermoelectric powers $\alpha_{R5}$ and $\alpha_{R6}$ at junctions 5 and 6. When a transient signal current flows from the p-type semiconductor component (2) to the n-type semiconductor component (3), the electrode (7) has the plus voltage polarity and the electrode (8) the minus voltage polarity. When the direction of the signal current flowing through said element is reversed, the junction temperature and the temperature at both electrodes are reversed and the voltages polarities of the electrodes are also reversed.

These Peltier heat absorption, heat generation and Seebeck back electromotive force will occur through extremely swift behaviors of the electrons based on the electrical current through junction (4) and both electrode junctions (5), (6) of the element. Hence, the back electromotive force will cancel and inhibit quickly the back electromagnetic induction voltage which is the cause of the standing wave noise generated particularly at around zero output current by the inductance component of the coil on abrupt reversal of the direction of the current passing through the coil circuit of the electromagnetic device. As the result, the noise is eliminated, and the output signal is maintained at the normal wave form faithful to the input signal, whereby remarkable improvement of the output signal is brought about.

Examples of materials with different electroconduction types can include metals and semiconductors as seen in Tables 1, 2 and 3. These materials are materials with high absolute values of thermoelectric power. Among them, suitable materials may include thermoelectric semiconductor materials. These materials have high absolute values $\alpha$ ($\mu VK^{-1}$) of thermoelectric power, and low resistivity $\rho$ ($\Omega \cdot m$) and thermal conductivity $\kappa$ ($Wm^{-1}K^{-1}$). Therefore, both the generation of the temperature difference $\Delta T_t$ by the Peltier effect and the generation of the back electromotive force $\alpha\Delta T_t$ (V) are high. The thermoelectric material is characterized by Z, where $z=\alpha^2\rho^{-1}\kappa^{-1}$, it is called the figure of merit. The use of electroconductive materials with high values of z for the component of the element produces a good noise eliminating element.

Examples of the materials to be used for the noise eliminating element are described in more detail. At the present time, bismuth-tellurium system materials, leadgermanium-tellurium system materials, silicon-germanium system materials, selenium compound materials, iron silicide materials, etc. are suitable. In the following, representative literature describing preparation and properties of these materials are shown below:

R. B. Horst and L. R. Williams: "Preparation and Properties of High-Performance $(Bi,Sb)_2(Te,Se)_3$ Alloys", Proc. 4th International Conference on Thermoelectric Energy Conversion (ICTEC), Arlington, p. 119 (1982).

R. W. Bunce and D. M. Rowe: "The Vacuum Hot-Pressing of Germanium and Silicon-Germanium Alloys", J. Phys., 16D, 941 (1977).

J. C. Bass and N. B. Elsner: "Segmented Selenide Thermoelectric Generator", Proc. 3rd ICTEC, p.8 (1980).

Examples of the bismuth-tellurium system p-type material may include those of $(Sb_2Te_3)_A(Bi_2Se_3)_B(Sb_2Se_3)_c$ (A=70–72, B=23–27, C=3–5) in which Te is added as the donor.

Examples of the n-type materials of the same system may include those of $(Bi_2Te_3)_D(Sb_2Se_3)_E(Bi_2Se_3)_F$ (D=90–98, E=0 –50, F=2–5) in which a metal halide such as $SbI_3$, $HgBr_2$ is added as the donor. These p-type and n-type materials all have absolute values of thermoelectric power at room temperature of 180 $\mu VK^{-1}$, resistivities of $1\times10^{-5}\Omega\cdot m$ or lower and thermal conductivities of 1.6 $Wm^{-1}K^{-1}$ or lower. Therefore, their figures of merit at temperature are all $2\times10^{-3}$ $K^{-1}$ or higher. Further, the figures of merit will continue to be high to around 370 K.

Next, the method for manufacturing the component is to be described. A bulk component can be made according to such method as the crystal growth method according to one-directional solidification, cold or hot pressed powder sintering method, etc. A thin film or thick film component can be made according to such method as the physical vapor deposition method (PVD) (vacuum vapor deposition method, ion beam method, sputtering method, reacting beam method, etc.), the diffusion method (CVD method, PCVD method, ion implantation method, etc.), spraying method (flame spraying method, explosion method, plasma method), the wet electro plating method, the printing method, the rolling method, the extrusion method, etc. Also, the p-n junction can be formed at the same time or continuously in the course of the preparation of these components.

The noise eliminating element of the present embodiment can be prepared with extremely high performances and also small size, light weight, low cost by junctioning small amounts of semiconductor materials with different electroconduction types as described above.

For the noise eliminating element of the present element, p-type and n-type materials at room temperature of the above-mentioned bismuth-tellurium system were employed. Its absolute value of thermoelectric power exceeds plus or minus 200 $\mu VK^{-1}$, resistivity $1\times10^{-5}$ $\Omega\cdot m$ and thermal conductivity 1.5 $aWm^{-1}K^{-1}$. Accordingly, the Figure of merit is $2.7\times10^{-3}K^{-1}$. The dimensions of the material can be between $0.4\times0.4\times1.3$ mm–$\phi 5.0\times4.5$ mm. Each component was junctioned with Bi—Sn eutectic alloy into the shape of FIG. 2(a) or (c) to constitute a noise eliminating element.

Other than that as described above, the noise eliminating elements shown in Table 4 were prepared, and assembled in speaker circuits, television picture circuits, etc. for confirmation of the noise eliminating effect. However, these junctioning methods, material properties, dimensions and shapes are merely exemplary and will not restrict the scope of claim for patent of the present invention. If thermoelectric materials with still better figure of merit are developed, these can be effectively utilized as electroconductive materials of the present invention.

FIG. 3 is an embodiment of the electromagnetic device circuit of the present invention, by taking an example of acoustic instrument as the electromagnetic device, in which at least one of the noise eliminating elements of the present invention is inserted in series into the connecting circuit of the acoustic output circuit which contains the amplification circuit and the voice coil. Acoustic equipment of the prior art include electrodynamic and electrostatic type speakers, but most of the speakers presently available are of the electrodynamic type. The present embodiment concerns an electrodynamic type speaker circuit.

In an electrodynamic speaker, a vibrating plate having a voice coil, namely a coil portion of the vibrating system is placed in the magnetic field of a magnet. When the current flows through the coil, the vibrating plate will be vibrated through action of electromagnetic induction to radiate sound waves. Ideally, when the original sound is soundless, the acoustic driving current of the speaker is zero, the voice coil is at the neutral point of the vibration system, and there should be no vibration of the speaker voice coil, namely the vibrating plate. However, at the neutral point of such a vibration system, even as seen from the mechanics elastic systems, the vibrating plate will easily follow mechanical and electromagnetic forces to generate noise.

For example, under the situation where the input signal becomes abruptly 0 from a large value, the vibrating plate should quickly stop vibrating from the original acoustic current. However, mechanical elastic vibration is present in the vibration system, and the residual amount is larger as the amplitude of the original vibration is greater. Such phenomenon is inevitable in the structure of electrodynamic type speakers. The mechanical residual vibration of the coil portion will give rise to a back electromotive force through the electromagnetic induction of the coil and the magnet's magnetic field, whereby the current caused by the back electroconductive force flows through the voice coil. This current generates noise in the neutral point region which should be inherently soundless, thereby making the original sound unclear and unpleasant.

This noise is further fed back to the voice coil to cause electrical interference to occur, and such phenomenon is repeatedly superimposed. As the result, reproduced sound will be generated from the speaker, which includes extremely complicated and harmful noises with great energies not found in the original sound such as standing wave noises by these acoustic, electrical interferences and sometimes resonance. Such noises are liable to arise at the neutral point of the voice coil. For this reason, in the neutral point region which should be inherently soundless, unpleasant sound not found in the original sound, which irritates the auditory nerve, is mixed into the reproduced sound of acoustic equipment to impair sound quality.

On the other hand, in the amplification circuit of an acoustic equipment, there exists external disturbances such as noises introduced from power sources of 50–60 Hz, impact noises such as thunder, an ignition plug of an automobile, etc., and internal noises occurring due to complicated behaviors of electrons such as thermal movement or scattering in electronic parts such as resistors or semiconductor elements. The sound waves, which include these noises which are generated from the speaker, will undergo resonance with speaker·casing etc. The sound waves will generate a resonance current through the voice coil circuit by the microphone effect of the speaker, thereby creating a noise of great energy.

Figure 3A:
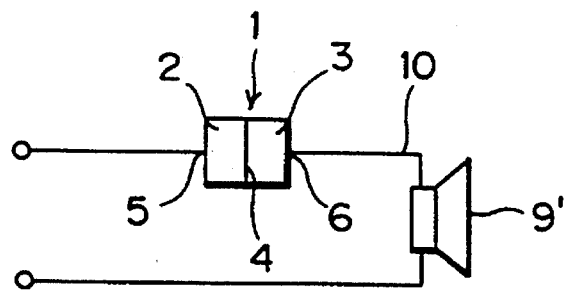
FIGS. 3a to 3d are illustrations showing embodiments of coil circuits for an acoustic equipment device having the noise eliminating element according to the present invention, (a) , (b) showing embodiments of using the element for a monaural speaker circuit, and (c) , (d) for a stereophonic speaker circuit.
Figure 3B:
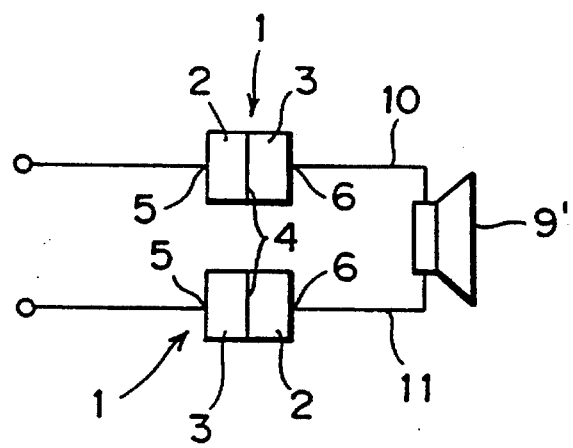
Figure 3C:
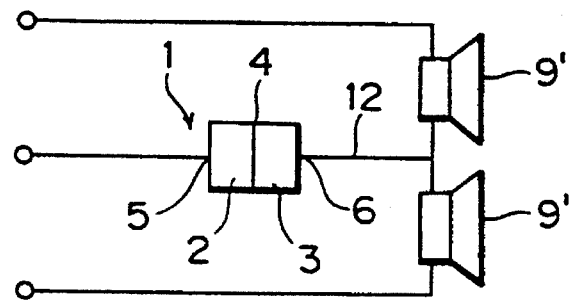
Figure 3D:
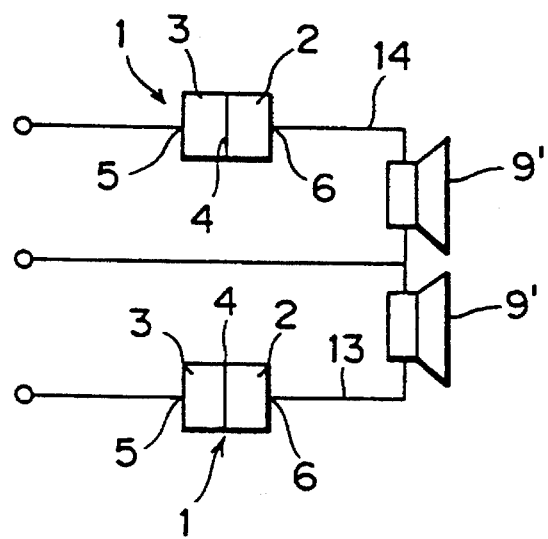

FIG. 3(a) shows an example having one noise eliminating element of the present invention connected and inserted in series into the circuit (10) of the monaural speaker (9'). FIG. 3(b) shows an example with each circuit having one noise eliminating element, two in all, connected and inserted in series into the circuits (10), (11) of the monaural speaker (9'). FIG. 3(c) shows an example having one noise eliminating element connected and inserted in series into the common circuit, namely the common (12) of the stereo-speakers (9'). FIG. 3(d) shows an example having one noise eliminating element into each of the left and right circuits (13), (14) of the stereo- speaker (9').

In the noise eliminating element, and the circuit having the element connected and inserted in series into the circuit connecting the acoustic equipment to the speaker voice coil of the present invention, heat absorption or heat generation according to the Peltier effect takes place which is proportional to the thermoelectric power possessed by said element, the current flowing through it and its absolute temperature. Whether it is heat absorption or heat generation depends on the direction of the current flowing through said element by the acoustic current flowing through said element.

When said element (1) is connected so that the current may flow from the p-type semiconductor component (2) to the n-type semiconductor component (3), Peltier heat generation occurs in said element junction (4), while Peltier heat absorption in the electrode junctions (5), (6). Accordingly, said element junction (4) has a higher temperature than the electrode junctions (5), (6), thereby creating a temperature difference between said element junction (4) and the electrode junctions (5), (6). Also, at the same time, back electromotive forces due to the Seebeck effect are generated, with the plus at the electrode junction (5) and the minus at the electrode junction (6). The back electromotive forces cancel and inhibit the back electromagnetic induction electromotive force generated by the mutual reaction between the coil and the magnet's magnetic field generated when the acoustic current becomes zero, and consequently inhibits the noise which causes the standing to be generated at around the zero level.

Speakers have been frequently used for all of the acoustic equipment such as a wireless transmittor, telephone, radio, television, video, tape recorder, record player, loud speaker, transciever, etc., and the noise eliminating element (acoustic improvement element) of the present invention can be simply inserted into the combined circuit of such existing acoustic equipment and voice coil.

Also, into the speaker voice coil of the acoustic equipment to be produced in the future, the acoustic improvement element of the present invention can be added inexpensively according to an extremely simple working step during production at the acoustic output terminal within the amplification circuit or in the course of the voice coil circuit wiring.

The noise eliminating element of the present invention eliminates the unpleasant sounds due to the noise generated around the voice coil neutral point over the whole region of the audible frequency band of 30 to 18000 Hz, thereby, the speaker of the acustic equipment generates sounds of extremely good quality.

Therefore, the present invention will make extremely great contributions to not only industries but also to all social environments, artistic cultures and mental hygienes with speaker sounds.

FIG. 4 shows an embodiment of the present invention in electronic image display devices, typically a television image receiver, where the electromagnetic device in which the noise eliminating element of the present invention is used in its output circuit. In the electronic image display device, to reproduce correctly images, a synchronized deflecting circuit is used. In order for the scanning of picture signals on the image receiving side to coincide with the timing of the resulting scanning on the image sending side, the circuit controls the direction of the electron beam irradiated onto the fluorescent screen. Generally speaking, in electronic image display devices, the neck portion of the image generating tube contains, two sets of deflecting coils (15) and (16) for horizontal use and vertical use.

As shown in FIG. 5(a), the "saw" wave currents A–B–C that flow through the coils have respectively frequencies of about 15.734 KHz in the horizontal coil and about 59.94 Hz in the vertical coil. The scanning line period $t_s$ and the fly-back line period $t_b$ in the Figure, change repeatedly in the current direction with the zero value of the current as the center. With such a current, the electron beam is given the force in the direction of the vector sum of the forces from the magnetic fields of the respective coils, whereby the electron beam is deflected up and down, right and left, so as to give the defined row of luminescent spots, namely luster, on the fluorescent screen.

An electron beam goes through the vacuum portion of the deflecting coil, and within the deflecting coil circuit are included a deflecting coil and other electrical parts having inductance components such as a transformer, etc. When the saw wave current reverses in direction around the zero value, particularly during the period of B–C, the back electromotive voltage due to electromagnetic induction is generated. The cyclic back electromotive voltage, increases the irregular standing wave noise current that always exists and is centered around the region of the zero value of the "saw" wave current. The standing wave noise current is superimposed on the normal "saw" wave current there results a "saw" wave current with an extremely irregular wave form as shown in FIG. 5(b), whereby deviation from the normal luster occurs. As a result, the electronic image display reproduced on the fluorescent screen becomes extremely indistinct.

In the embodiment of the present invention shown in FIG. 4, the circuit constitution is made such that each noise eliminating element (1) is connected in the course of the wirings combining the terminals (17), (18) with the horizontal deflecting output terminals (21), (22) of the horizontal deflecting coil (15), and the terminals (19), (20), and the vertical deflecting output terminals (23), (24) with the vertical deflecting coil (16), for example, in series to the sides of the coil terminals (17), (21), and (20) and (24).

On such circuits, the operation of the present invention is described by referring to the horizontal deflecting circuit (15) as an example. Suppose that the horizontal deflecting output terminal (22) is the plus polarity of the "saw" wave, and said element (1) is connected so that the current may flow from the n-type (3) to the p-type (2). At this time Peltier heat absorption takes place in the element junction (4) and Peltier heat generation in the electrode junctions (5), (6), whereby the element junction (4) becomes lower in temperature than the electrode junctions (5), (6). For this reason, a temperature difference is created between the element junction (4) and the electrode junctions (5), (6), and through such temperature difference, back electromotive forces due to the Seebeck effect are generated with plus polarity at the electrode junction (5) and minus polarity at (6).

The current due to the Seebeck back electromotive force will inhibit and cancel the back electromagnetic induction current through the mutual reaction between the current and the coil which is the cause for the standing wave generated in the process of the "saw" wave current crossing the 0 point. This effect exhibits the same effect regardless of the direction of the polarity of said element and the horizontal deflecting output terminal.

Similar phenomenon also occurs in the process of reversal of the current directions of the "saw" waves in the horizontal and vertical deflecting coil circuits, whereby the normal "saw" wave form of the electronic image display device can be constantly maintained. As a result, extremely normal luster can be realized to obtain a sharp electronic image display faithful to input signals.

Figure 6:
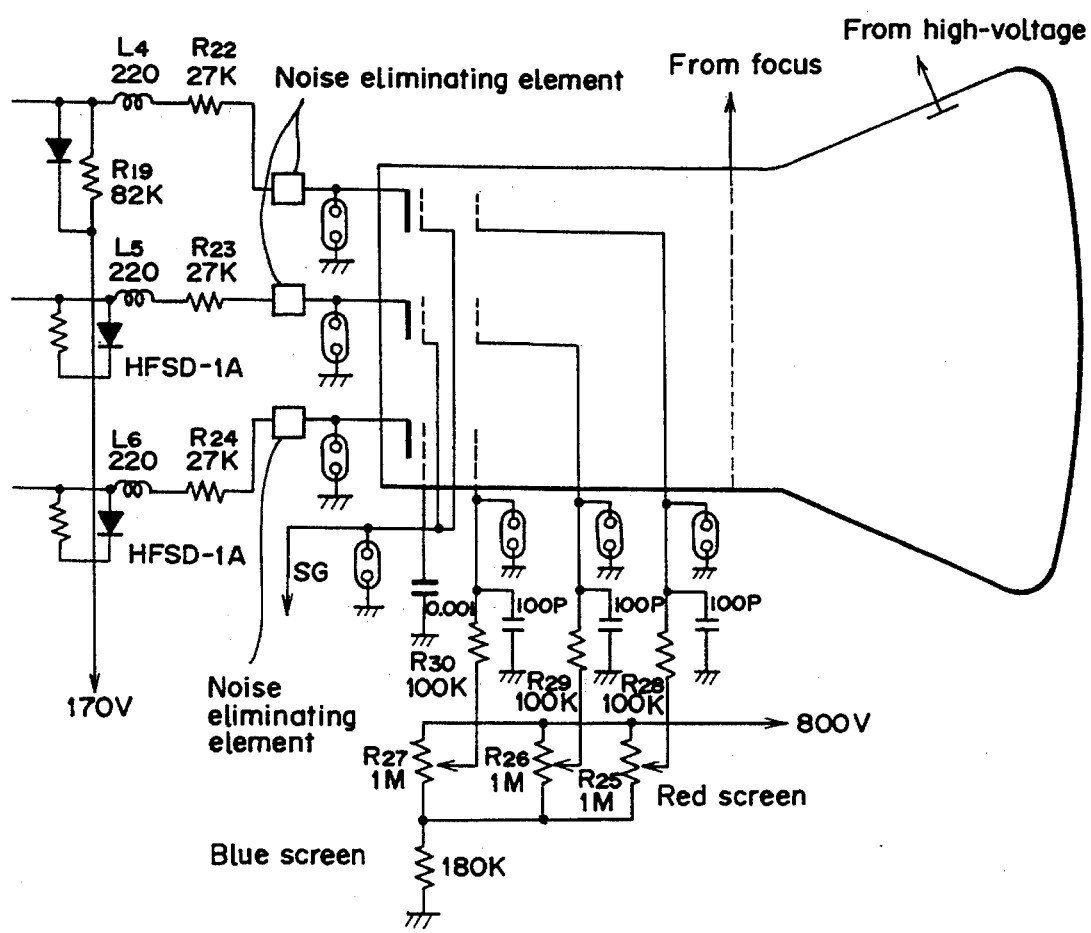
FIG. 6 shows an embodiment having noise eliminating elements inserted in series into the cathode of the picture tube and the picture output circuit of a television.

In the embodiment wherein said element is inserted in series in the cathode of the image receiving tube and within the image output circuit of color television (FIG. 6), particularly black, white, intermediate colors became better, with smaller letters and representations being clearly displayed. This result indicates that not only the wave form near the output 0 but also the noise on the wave form applied with a direct current bias can be effectively eliminated.

Figure 7:
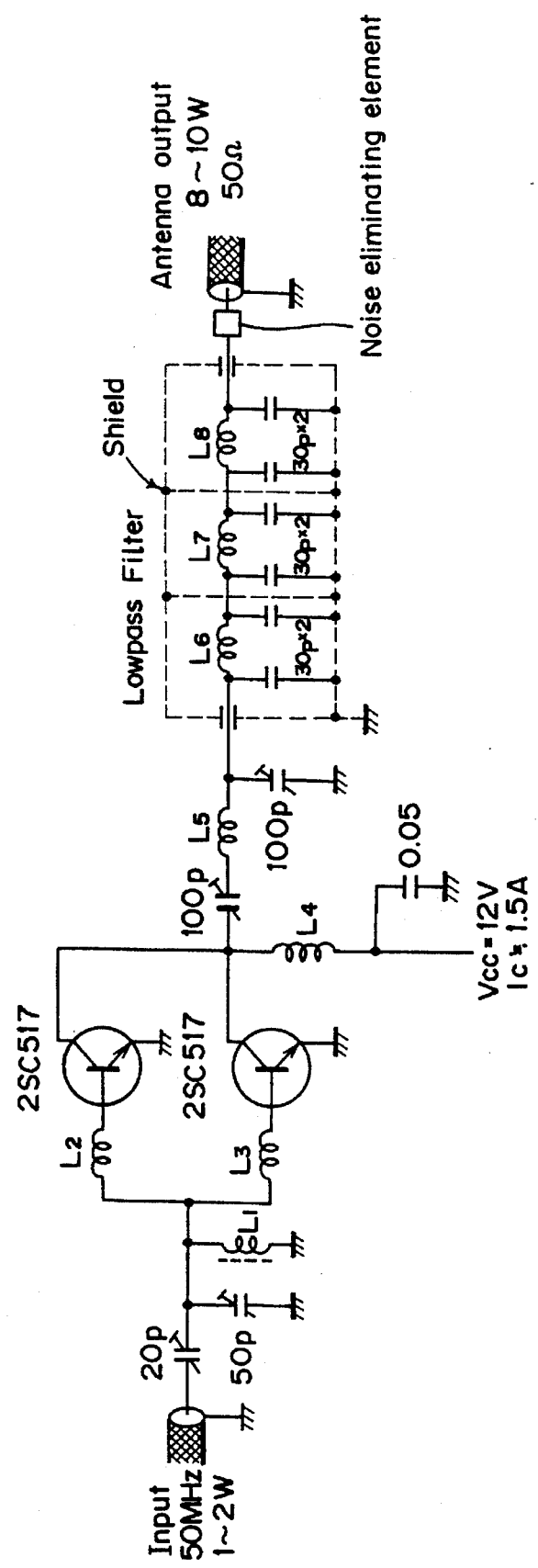
FIG. 7 shows an embodiment having a noise eliminating element inserted into a transmitter antenna circuit.
Figure 8:
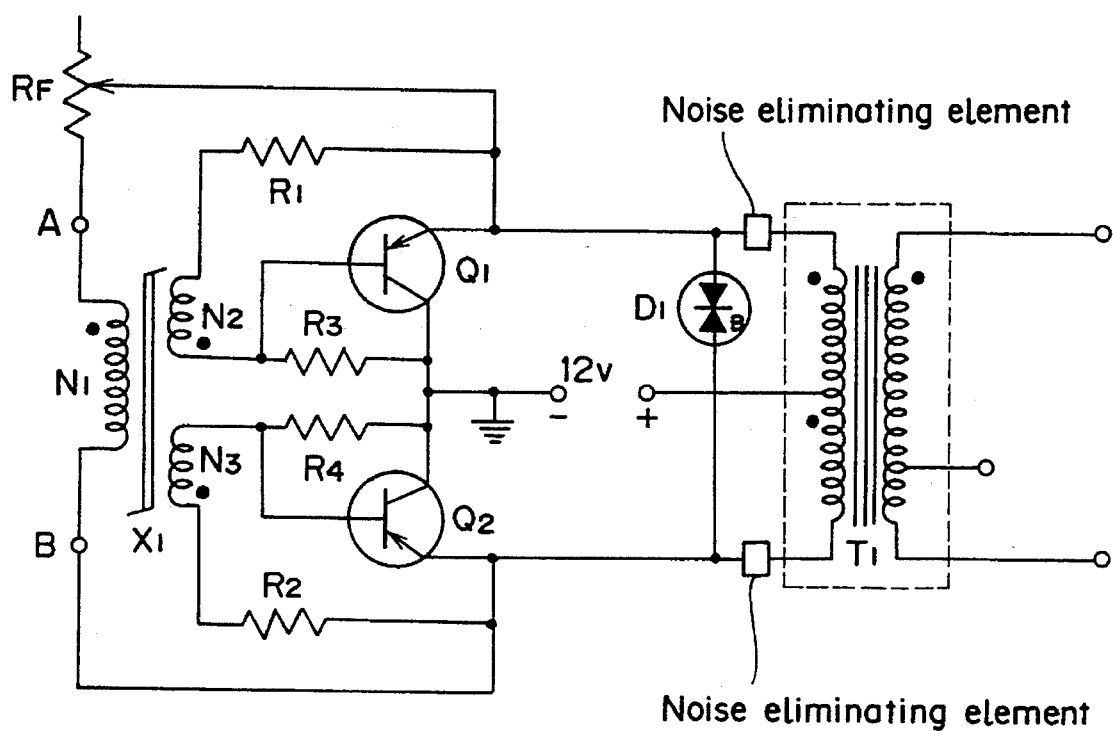
FIG. 8 shows an embodiment having a noise eliminating element inserted into an inverter circuit.

Table 5 shows specific examples of equipment such as radio, television, etc. used for the confirmation tests of the embodiments of the present invention. For these equipment, the noise eliminating elements shown in Table 4 were inserted in the circuit for confirmation of the noise eliminating effect. Also, FIG. 7 shows an embodiment where the noise eliminating element is inserted into the transmitter antenna circuit, and FIG. 8 an embodiment where the noise eliminating element is inserted into the inverter circuit.

The places where the noise eliminating element is inserted are only examples, and are not limitative of the insertion places of said element in electromagnetic devices.

The noise eliminating element of the present invention is novel and constitutes a major advancement as well as a major usefulness as follows: (1) both the Seebeck and the Peltier effects occur simultaneously and create a transient phenomena in one element, (2) the transient phenomenon based on both effects is utilized to eliminate noises, particularly the standing wave noise generated at around zero value of output current, (3) it is different from the thermoelectric cooling element, because here the thermoelectric materials of different kinds are directly connected and there is no cooling plate in between. Also, the element of the present invention can be produced in large quantities of extremely small size, light weight and low cost.

The electromagnetic circuit having the noise eliminating element of the present invention can be manufactured by the extremely simple operation of connecting and inserting said element in series to the connecting circuit between the signal output circuit and the coil of the electromagnetic device of the prior art.

Besides the electromagnetic device, the acoustic equipment and electronic image display device described in the embodiments, a large number of other devices have been utilized, including a switching regulator, tape recorder, pen recorder, input transformer, microphone, antenna for transmission, inverter, convertor, etc. The noise eliminating element of the present invention can be inserted by simple addition to the connecting circuit of the signal output circuit and the coil of those already existing electromagnetic devices. Also, its effect is conspicuous, and the invention of the electromagnetic device circuit having said element is an extremely novel and useful invention. In the design stage of high speed pulse circuits, electronic printed circuits, electronic wiring, etc., although they are not electromagnetic devices, the noise elimnating element of the present invention is also effective for the prevention of the standing wave and the reflection wave generated by inductance.

Besides, in the coil circuit of the electromagnetic device, etc. to be produced in the future, the noise eliminating element of the present invention can be added with an extremely simple working step at low cost at the output of the portion on a printed substrate, the coil terminal portion or in the course of the coil circuit wiring.

The electromagnetic device, etc. having the noise eliminating element of the present invention can eliminate the standing wave noise generated within the coil circuit over the whole region of the output frequency band, and provides an electromagnetic device, etc. of extremely good quality.

Therefore, the noise eliminating element of the present invention and the circuit having this element in the electromagnetic device, etc. will make extremely great contributions to all social environments, artistic cultures, mental hygienes, scientific techniques with electromagnetic devices, etc.

TABLE 1

Thermoelectric Properties of various Materials

| Material | Thermoelectric Power $\alpha$ ($\mu VK^{-1}$) | Resistivity $\rho$ ($\Omega \cdot cm$) | Thermal Conductivity $\kappa$ ($Wm^{-1} K^{-1}$) | Figure of Merit $Z \times 10^3$ ($K^{-1}$) |
|---|---|---|---|---|
| 1  Sb | +41 | $4 \times 10^{-7}$ | 22.4 | 0.19 |
| 2  Bi | −80 | $1.2 \times 10^{-6}$ | 7.5 | 0.78 |
| 3  BiSb | −77 | $2.0 \times 10^{-6}$ | 5.4 | 0.55 |
| 4  ZnSb | +175 | $1.9 \times 10^{-5}$ | 2.1 | 0.77 |
| 5  $Sb_2Te_3$ | +100 | $3.3 \times 10^{-6}$ | 3.2 | 0.9 |
| 6  PbSe | −160 | $9.1 \times 10^{-6}$ | 2.4 | 1.1 |
| 7  PbTe | −160 | $6.7 \times 10^{-6}$ | 2.8 | 1.4 |
| 8  $Bi_2Te_3$ | +170 | $1.0 \times 10^{-5}$ | 1.8 | 1.6 |
| 9  75% $Bi_2Te_3$-25% $Bi_2Se_3$ | −166 | $1.03 \times 10^{-5}$ | 1.33 | 2.0 |
| 10  75% $Bi_2Te_3$-25% $Bi_2Se_3$ (CuBr added) | −150 | $6 \times 10^{-4}$ | 2.0 | 1.88 |
| 11  50% $Bi_2Te_3$-40% $Sb_2Te_3$-10% $Sb_2Se_3$ | +155 | $8 \times 10^{-4}$ | 1.5 | 2.00 |
| 12  30% $Bi_2Te_3$-70% $Sb_2Te_3$ (2 wt % Te) | +195 | $9.2 \times 10^{-6}$ | 1.48 | 2.8 |
| 13  25% $Bi_2Te_3$-75% $Sb_2Te_3$ (2.3 wt % Te) | +196 | $7.8 \times 10^{-6}$ | 1.49 | 3.3 |
| 14  25% $Bi_2Te_3$-75% $Sb_2Te_3$ (1.75 wt % Se) | +210 | $9.8 \times 10^{-6}$ | 1.27 | 3.54 |

Reference: Semiconductor Handbook (2nd ed.), p. 461, Ohm Publications, Japan (1982)

TABLE 2

Thermoelectric Properties of various Materials

| Material | Conduction Type | Power Factor $\alpha^2 \rho^{-1}$ (Wm$^{-1}$ K$^{-2}$) | Thermal Conductivity $\kappa$ (Wm$^{-1}$ K$^{-1}$) | Figure of Merit $Z \times 10^3$ (K$^{-1}$) | Temperature (K) |
|---|---|---|---|---|---|
| 1  $Bi_2Te_3$ | + or − | 4.0 | 2.0 | 2.0 | 300 |
| 2  $BiSb_4Te_{7.5}$ | + | 4.6 | 1.4 | 3.3 | 300 |
| 3  $Bi_{0.5}Sb_{1.5}Te_{2.9}$(Se) | + | 4.4 | 1.5 | 2.9 | 290 |
| 4  $Bi_{0.5}Sb_{1.5}Te_{2.8}$(Se) | + | 3.7 | 1.5 | 2.4 | 290 |
| 5  $BiSbTe_3(Pbl_2)$ | + | 3.5 | 1.4 | 2.5 | 350 |
| 6  $Bi_2Te_{2.85}$(Se) | − | 4.4 | 1.6 | 2.8 | 600 |
| 7  $Bi_{0.8}Sb_{0.2}Te_{2.85}$(Se) | − | 4.8 | 1.5 | 3.2 | 600 |
| 8  $Bi_2Te_{2.85}$(Se) | − | 5.0 | 1.6 | 3.1 | — |
| 9  $Bi_2Te_3$(Se) | − | 3.3 | 1.5 | 2.2 | 550 |
| 10 PbTe | + or − | 2.7–3.5 | 2.3 | 1.2–1.5 | 900 |
| 11 GeTe(Bi) | + | 3.2 | 2.2 | 1.5 | 900 |
| 12 TAGS | + | 2.0 | 1.0 | 2.0 | 900 |
| 13 Si—Ge | + or − | 2.0–3.0 | 3.6 | 0.6–0.9 | 1200 |
| 14 Si—Ge(GaP) | + or − | 2.5–3.0 | 2.6 | 0.9–1.2 | 1300 |
| 15 $FeSi_2$ | + or − | 0.7–1.7 | 3.5 | 0.2–0.5 | 1200 |

Reference: D. A. Wright: Metall. Rev., 15, (1970) 147.

TABLE 3

Thermoelectric Power

| Seebeck (1822) | Absolute Thermoelectric Power [μVK$^{-1}$] | | Justi (1948) [μVK$^{-1}$] | | Meisner (1955) [μVK$^{-1}$] | | | |
|---|---|---|---|---|---|---|---|---|
| | | | | | Element | | Compound | |
| PbS | PbS | −160 | Bi | −80 | Bi | −70 | MoS | −700 |
| Bi | Bi | −78.9 | Co | −21 | Co | −17.5 | ZnO | −714 |
| Bi Amalgam | | | Ni | −20 | Ni | −18 | CuO | −696 |
| Ni | Ni | −20.1 | K | −14 | K | −12 | $Fe_2O_3$ | −613 |
| Co | Co | −18.5 | Pd | −8 | Pd | −6 | (623 K) | |
| Pd | Pd | −11.0 | Na | −7 | Na | −4.4 | FeO | −500 |
| Pt No. 1 | Pt | −5.26 | Pt | −5 | Pt | −3.3 | $Fe_3O_4$ | −430 |
| U | U | +1.4 | Hg | −5 | Hg | −3.4 | $FeS_2$ | −200 |
| Au No. 1 | Au[a] | +1.5 | C | −3.5 | | | $MgO_3H_3$ | −200 |
| Cu No. 1 | Cu[a] | +1.86 | Al | −1.5 | Al | −0.6 | SnO | −139 |
| Rh | Rh | +1.7 | Mg | −1.5 | Mg | −0.4 | $Fe_2O_3$ | −60 |
| Au No. 2 | Au | +2.5 | Pb | −1.0 | Pb | −0.1 | (323 K) | |
| Ag | Ag | +2.4 | Sn | −1.0 | Sn | −0.1 | CdO | −41 |
| Zn | Zn | +2.31 | Cs | −0.5 | Cs | +0.2 | CuS | +7 |
| C | C | +1.74 | Y | −1.0 | Y | +2.2 | FeS | +26 |
| Cu No. 3 | Cu[b] | +3.1 | Rh | +1.0 | Rh | +2.5 | CdO | +30 |
| Pt No. 4 | | | Zn | +1.5 | Zn | +2.9 | $GeTiO_3$ | +140 |
| Cd | Cd | +3.7 | Ag | +1.5 | Ag | +2.4 | NiO | +240 |
| Steel | Steel[c] | +7.9 | Au | +1.5 | Au | +2.7 | $Mn_2O_3$ | +385 |
| Fe | Fe | +12 | Cu | +2.0 | Cu | +2.6 | $Cu_2O$ | +474 |
| As | As | +50 | W | +2.5 | W | +1.5 | $Cu_2O$ | +1000 |
| Sb | Sb | +43.5 | Cd | +3.5 | Cd | +2.8 | $Cu_2O$ | +1120 |
| $Sb_2Zn_3$ | Sb-Zn | +88.0 | Mo | +6.5 | Mo | +5.6 | $Cu_2O$ | +1150 |
| SbZn | SbZn | +200 | Fe | +12.5 | Fe | +16 | | |
| Te | Te | +400 | Sb | +42 | Sb | +35 | | |
| | | | Si | +44 | | | | |
| | | | Te | +49 | Te | +400 | | |
| | | | Se | | Se | +1000 | | |

[a] high purity, [b] low purity, [c] for spring, [d] Sb(60)-Zn(40) alloy
Reference: Kamekichi Shiba: "Physical Constant Table", Iwanami Publications, Japan (1949)
Shuichi Iida et al: "Physical Constant Table", Asakura Publications, Japan (1969)

TABLE 4

Noise Eliminating Elements examined

| Material | Material Processing | Material Dimensions (mm) Cross-section | Length | Number of Couples | Type | Resistance (Ω) |
|---|---|---|---|---|---|---|
| a) Bi—Te | One-directional Solidification | 1.0 × 1.0 | 1.27 | 1 | ①② | 0.03 |
| b) Bi—Te | " | " | " | 7 | ③ | 0.21 |
| c) Bi—Te | " | " | " | 17 | ③ | 0.51 |
| d) Bi—Te | Hot Pressing | 0.64 × 0.64 | 1.00 | 1 | ② | 0.06 |
| e) Bi—Te | " | " | " | 12 | ③ | 0.72 |
| f) Bi—Te | One-directional Solidification | φ5.0 | 4.5 | 1 | ② | 0.005 |
| g) Fe—Si | Cold Pressing | 2.0 × 2.0 | 1.0 | 1 | ① | 0.10 | a), b), c): Courtesy Melcor (Materials Electronic Products Corp.), 994 Spruce St., Trenton, NJ 08648 USA Tel: (609)393-4178/Fax: (609)393-9461
Type: a) CP 1.0-050  b) CP 1.0-1-050  c) CP1.0-17-050L

TABLE 5

Electronic Equipments examined
All the noise eliminating elements [a) to g)] of Table 4 were inserted into the speaker circuits, horizontal & vertical deflecting circuits and picture circuits of television [① to ⑨] mentioned below.

| | Equipment | Manufacturer | Model |
|---|---|---|---|
| ① | Portable Radio | Sony | SONY ICF-S54V TV/FM/AM 3BAND RECEIVER |
| ② | Speaker for Tape Recorder "Walkman" | " | SONY SRS-37 SPEAKER SYSTEM |
| ③ | Monaural-radio | " | SONY ICF-76000 FM/LW/MW/SW RECEIVER |
| ④ | Stereo-radio | Nihon Victor | STEREO RADIO CASSETTE RECORDER MODEL NO. RC-F2 |
| ⑤ | Stereo-radio | " | VICTOR G-HORN MULTIPLEX FM/AM/TV STEREO SOUND CD PORTABLE SYSTEM MODEL NO. RC-X7 |
| ⑥ | Television having Satellite Broad-casting receiver | Matsushita Denki | Panasonic TH-29AS1 |
| ⑦ | Video Cassette Recorder | " | Panasonic NV-FS70 |
| ⑧ | Television | Sharp | MULTIPLEX SOUND SYSTEM 25C-SV1 |
| ⑨ | Portable Television | Epson | MODEL NO. EF-303 |

1) No noise eliminating element was inserted into the horizontal · vertical deflecting circuits and picture circuit of (9) liquid crystal porgable television.
2) The noise eliminating elements inserted into the speaker circuits were all tested with the element terminals effect was recognized.
3) As to presence of the noise eliminating effect in parallel with a small resistance inserted into the horizontal · vertical deflecting circuit and picture circuit of television, the improvements are confirmed by the visual examination of photographs of the video picture obtained with the noise eliminating elements.

We claim:

1. A method of using a Peltier element to reduce electrical circuit noise in an electrical circuit which includes an electromagnetic device, comprising the steps of:
   providing an electrical circuit to produce an alternating electric current through an electromagnetic device;
   coupling a Peltier element into said electrical circuit, said Peltier element comprising:
   (a) two components of different kinds of electroconductive materials,
   (b) a junction between said components,
   (c) two electrodes formed, respectively, by a part of said two components for coupling said element into said electrical circuit,
   said materials having a thermoelectric power which exceeds 50 μVK$^{-1}$ as an absolute value at an activating temperature of said element, and wherein there is substantially no rectifying action at said junction.

2. The method of claim 1, wherein the thermoelectric power of said materials exceeds plus or minus 100 μVK$^{-1}$ at the activity temperature of said element.

3. The method of claim 1, wherein the thermoelectric power of said materials exceeds plus or minus 200 μVK$^{-1}$ at the activity temperature of said element.

4. The method of claim 1, wherein the thermoelectric power of said materials exceeds plus or minus 300 μVK$^{-1}$ at the activity temperature of said element.

5. The method of claim 1, wherein said electrical circuit includes an electrical resistance, and further comprising the steps of coupling said Peltier element in parallel with said electrical resistance, and providing said Peltier element with a resistance larger than said electrical resistance.

* * * * *